(12) United States Patent
Zhao

(10) Patent No.: US 7,843,242 B1
(45) Date of Patent: Nov. 30, 2010

(54) PHASE-SHIFTED PULSE WIDTH MODULATION SIGNAL GENERATION

(75) Inventor: Bin Zhao, Irvine, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/537,692

(22) Filed: Aug. 7, 2009

(51) Int. Cl.
*H03K 3/017* (2006.01)

(52) U.S. Cl. ...................... 327/175; 327/172

(58) Field of Classification Search .................. None
See application file for complete search history.

(56) References Cited

U.S. PATENT DOCUMENTS

| | | | |
|---|---|---|---|
| 4,162,444 A | 7/1979 | Rodgers | |
| 4,615,029 A | 9/1986 | Hu et al. | |
| 4,649,432 A | 3/1987 | Watanabe et al. | |
| 4,686,640 A | 8/1987 | Simison | |
| 5,025,176 A | 6/1991 | Takeno | |
| 5,038,055 A | 8/1991 | Kinoshita | |
| 5,508,909 A | 4/1996 | Maxwell et al. | |
| 5,723,950 A | 3/1998 | Wei et al. | |
| 5,898,329 A * | 4/1999 | Hopkins | 327/176 |
| 6,281,822 B1 | 8/2001 | Park | |
| 6,864,641 B2 | 3/2005 | Dygert | |
| 6,943,500 B2 | 9/2005 | LeChevalier | |
| 7,262,724 B2 | 8/2007 | Hughes et al. | |
| 7,391,280 B2 | 6/2008 | Hsu | |
| 7,436,378 B2 | 10/2008 | Ito et al. | |
| 7,511,545 B1 | 3/2009 | Kesler | |
| 7,593,243 B2 * | 9/2009 | Ganev et al. | 363/44 |
| 7,800,415 B2 * | 9/2010 | Yedevelly et al. | 327/108 |
| 2004/0208011 A1 | 10/2004 | Horiuchi et al. | |
| 2004/0232964 A1 * | 11/2004 | Wiktor et al. | 327/172 |
| 2004/0233144 A1 | 11/2004 | Rader et al. | |

(Continued)

FOREIGN PATENT DOCUMENTS

JP 2003332624 A 11/2003

(Continued)

OTHER PUBLICATIONS

Mc Nerney, Tim, "constant-current power supply for Luxeon 5W LED with low-voltage warning and shut-off Software Documentation, as shipped to Mali in first 45 prototypes," Nov. 2004, www.designthatmatters.org/ke/pubs/kled-doc.txt, 5 pages.

(Continued)

*Primary Examiner*—Cassandra Cox

(57) ABSTRACT

A pulse width modulation (PWM) signal generator generates multiple output PWM signals from an input PWM signal, whereby each output PWM signal has a frequency and duty ratio substantially similar to the input PWM signal and each output PWM signal is phase-shifted in relation to the other output PWM signals. The PWM signal generator samples a PWM cycle of the input PWM signal to determine various PWM parameters representative of the duration of the active portion of the sampled PWM cycle and the total duration of the sampled PWM cycle. The PWM signal generator then uses the PWM parameters to generate corresponding PWM cycles for the output PWM signals using a set of two independent counters. This process of sampling a PWM cycle of the input PWM signal and generating the output PWM signals based on the PWM parameters resulting from the sampling process can be repeated for one or more iterations.

20 Claims, 5 Drawing Sheets

U.S. PATENT DOCUMENTS

| | | | |
|---|---|---|---|
| 2006/0064609 A1* | 3/2006 | Bryan | 714/700 |
| 2006/0186830 A1 | 8/2006 | Shami et al. | |
| 2007/0080911 A1 | 4/2007 | Liu et al. | |
| 2007/0253330 A1 | 11/2007 | Tochio et al. | |
| 2008/0054815 A1 | 3/2008 | Kotikalapoodi | |
| 2008/0297067 A1 | 12/2008 | Wang et al. | |
| 2009/0128045 A1 | 5/2009 | Szczeszynski et al. | |
| 2009/0187925 A1 | 7/2009 | Hu et al. | |
| 2009/0230874 A1 | 9/2009 | Zhao et al. | |
| 2009/0230891 A1 | 9/2009 | Zhao et al. | |
| 2009/0273288 A1 | 11/2009 | Zhao et al. | |
| 2009/0315481 A1 | 12/2009 | Zhao | |
| 2010/0026203 A1 | 2/2010 | Zhao et al. | |
| 2010/0085295 A1 | 4/2010 | Zhao et al. | |

FOREIGN PATENT DOCUMENTS

| | | | |
|---|---|---|---|
| JP | 2005116199 A | 4/2005 | |

OTHER PUBLICATIONS

Maxim: "Application Note 810, Understanding Flash ADCs," Oct. 2, 2001, 8 pages.
National Semiconductor Data Sheet: "LM3432/LM3432B 6-Channel Current Regulator for LED Backlight Application," May 22, 2008, pp. 1-18.
U.S. Appl. No. 12/537,443, filed Aug. 7, 2009, entitled "Pulse Width Modulation Frequency Conversion".
U.S. Appl. No. 12/703,239, filed Feb. 10, 2010, entitled "Pulse Width Modulation With Effective High Duty Resolution".
International Application No. PCT/US2009/035284, Search Report and Written Opinion, Oct. 28, 2009, 11 pages.
U.S. Appl. No. 12/625,818, filed Nov. 25, 2009, entitled "Synchronized Phase-Shifted Pulse Width Modulation Signal Generation".
U.S. Appl. No. 12/703,249, filed Feb. 10, 2010, entitled "Duty Transition Control in Pulse Width Modulation Signaling".
Luke Huiyong Chung, Electronic Products: "Driver ICs for LED BLUs," May 1, 2008, 3 pages.
Akira Takahashi, Electronic Products: "Methods and features of LED drivers," Mar. 2008, 3 pages.
U.S. Appl. No. 12/340,985, filed Dec. 22, 2008, entitled "LED Driver With Feedback Calibration".
U.S. Appl. No. 12/326,963, filed Dec. 3, 2008, entitled "LED Driver With Precharge and Track/Hold".
U.S. Appl. No. 12/367,672, filed Feb. 9, 2009, entitled "Configuration for Dynamic Power Control in LED Displays".
U.S. Appl. No. 12/424,326, filed Apr. 15, 2009, entitled "Peak Detection With Digital Conversion".
U.S. Appl. No. 12/504,841, filed Jul. 17, 2009, entitled "Analog-to-Digital Converter with Non-Uniform Accuracy".
U.S. Appl. No. 12/690,972, filed Jan. 21, 2010, entitled "Serial Cascade of Minimum Tail Voltages of Subsets of LED Strings for Dynamic Power Contrl in LED Displays".
U.S. Appl. No. 12/363,607, filed Jan. 30, 2009, entitled "LED Driver With Dynamic Headroom Control".
Texas Instruments Publication, "Interleaved Dual PWM Controller with Programmable Max Duty Cycle," SLUS544A, (UCC28220, UCC28221) Sep. 2003, pp. 1-28.

* cited by examiner

200

400

US 7,843,242 B1

PHASE-SHIFTED PULSE WIDTH MODULATION SIGNAL GENERATION

FIELD OF THE DISCLOSURE

The present disclosure relates generally to pulse width modulation (PWM) and more particularly to the parallel generation of multiple phase-shifted PWM signals.

BACKGROUND

Pulse width modulation (PWM) signals often are used for precise control of electronic devices, such as electric motors, light emitting diode (LED) backlights, and the like. In some systems, an input PWM signal is used to generate multiple PWM signals in parallel, and the multiple PWM signals are then used to drive one or more respective components. To illustrate, in LED display systems, each PWM signal of a set of parallel PWM signals is used to drive a separate set of LEDs connected in series. In generating multiple output PWM signals, it often is advantageous to synchronize the output PWM signals with the input PWM signal. To illustrate, in LED systems the input PWM signal often is synchronized with the display frame frequency, so a lack of synchronization between the output PWM signals and the input PWM signal can result in visual noise due to beating between the display frame frequency, the output PWM frequency, and their harmonics. Further, it can be advantageous to phase-shift the parallel output PWM signals in relation to each other to avoid or reduce undesirable effects, such as increased electromagnetic interference (EMI), large ripple in the power supply voltage when the components driven by the multiple PWM signals share the same power supply, and audible noise when the output PWM signals have a frequency in the human audible range (e.g., between approximately 0 Hz and 20 kHz). However, conventional systems typically utilize one or more phase-locked loops (PLLs) to generate multiple output PWM signals that are both synchronized with the input PWM signal and phase-shifted relative to each other. The use of these PLLs often substantially increases the cost and complexity of the system or introduces other undesirable effects. Further, the input PWM signal may have a relatively low frequency (e.g., as low as 100 Hz in a display system), thereby requiring a particularly complex PLL having a small loop bandwidth, which can result in a long locking time for the PLL, a relatively large silicon area to implement the PLL, and which may even require off-chip loop filtering and thus necessitate additional pins to interface with an-off chip filter. Accordingly, an improved technique for generating multiple phase-shifted PWM signals synchronized to an input PWM signal would be advantageous.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

FIGS. 1-5 illustrate a pulse width modulation (PWM) signal generator for generating multiple output PWM signals from an input PWM signal, whereby each output PWM signal has a frequency and duty ratio substantially similar to the input PWM signal and each output PWM signal is phase-shifted in relation to the other output PWM signals. In one embodiment, the PWM signal generator samples a PWM cycle of the input PWM signal to determine various PWM parameters representative of the duration of the active portion of the sampled PWM cycle (i.e., the portion of the sampled PWM cycle whereby the signal is configured to an active level (e.g., level "high" or level "1") and the total duration (i.e., period) of the sampled PWM cycle. The PWM signal generator then uses the PWM parameters to generate corresponding PWM cycles for the output PWM signals. This process of sampling a PWM cycle of the input PWM signal and generating the output PWM signals based on the PWM parameters resulting from the sampling process can be repeated for one or more iterations.

In order to provide output PWM signals more closely synchronized to the input PWM signal (i.e., having a substantially similar frequency as the input PWM signal) and in order to provide the desired relative phase-shifting among the output PWM signals, in one embodiment the PWM signal generator interleaves the use of two signal generation units to generate sets of PWM cycles for the output PWM signals. Each signal generation unit uses a separate counter to time the generation of the PWM cycles of the respective set of PWM cycles. Thus, the PWM signal generator uses one counter to time the generation of the even PWM cycles of the output PWM signals and uses the other counter to time the odd PWM cycles of the output PWM signals. By using independent counters to time the even and odd PWM cycles of the output PWM signals independently, the PWM signal generator is able to initiate the generation of each set of PWM cycles for the output PWM cycles in response to the initiation of the next PWM cycle of the input PWM signal while maintaining relative phase shifts between the output PWM cycles, and thus fully adhering to synchronization and phase-shift requirements without requiring the use of a phase-locked loop (PLL) or other similarly complex component.

Figure 1:
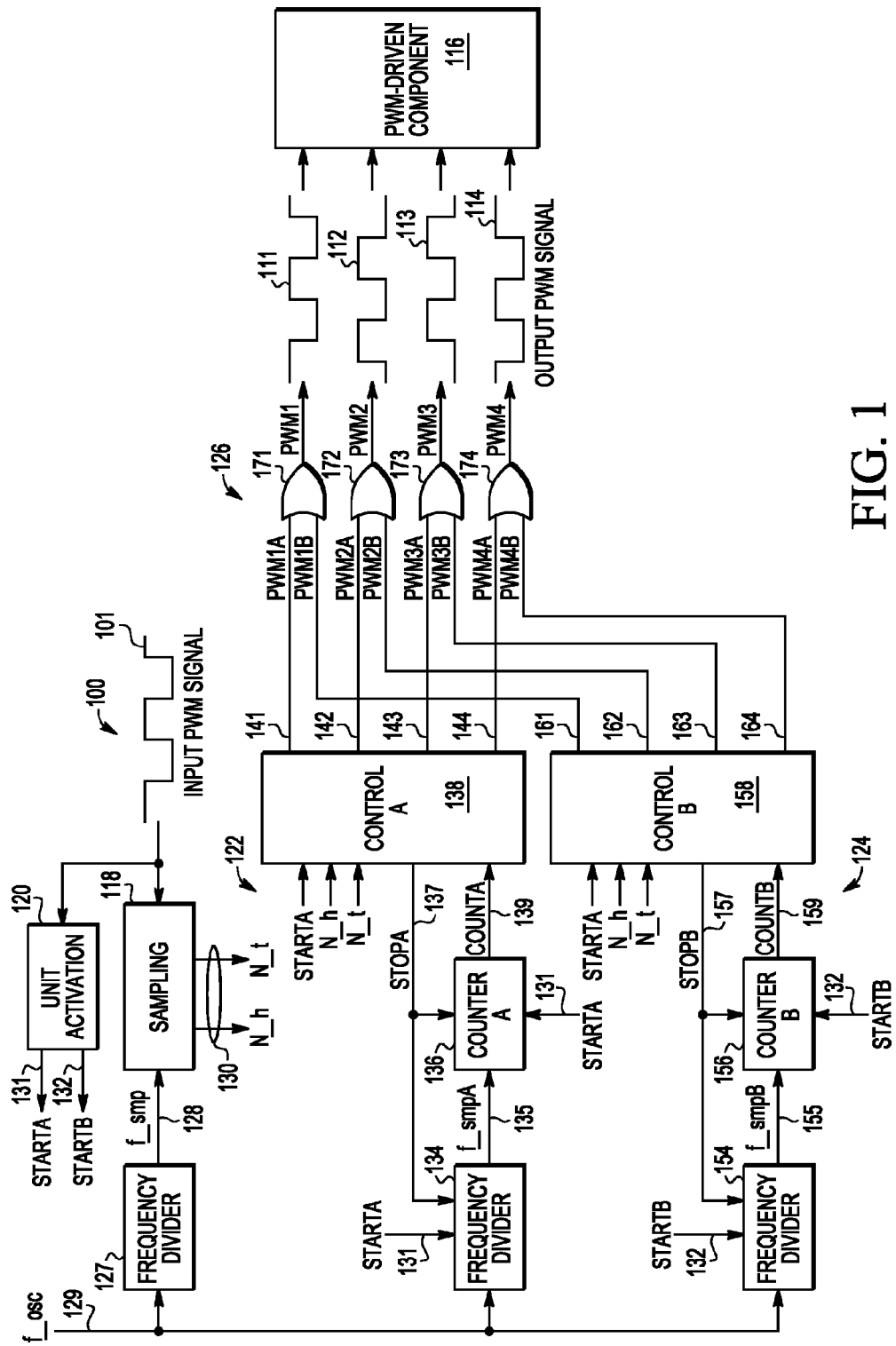
FIG. 1 is a diagram illustrating a pulse width modulation (PWM) signal generator in accordance with at least one embodiment of the present invention.

FIG. 1 illustrates a PWM signal generator 100 in accordance with at least one embodiment of the present disclosure. The PWM signal generator 100 receives an input PWM signal 101 and from this signal generates a plurality of output PWM signals (e.g., output PWM signals 111, 112, 113, and 114) having frequencies that are substantially equal to the frequency of the input PWM signal 101, and whereby each output PWM signal is phase-shifted relative to the other output PWM signals. The plurality of output PWM signals then may be used to drive or otherwise control operations of one or more PWM-driven components 116. The PWM-driven component 116 can include, for example, light emitting diodes (LEDs) of a LED-based display or an electronic motor. In one embodiment, the input PWM signal 101 is generated by a PWM source (not shown). The PWM source can include, for example, a video processor for a context whereby the input PWM signal 101 is a backlight control signal, a microcontroller for a context whereby the input PWM signal 101 is a motor control signal, etc. Although FIG. 1 illustrates an example implementation whereby four output PWM signals are generated, the techniques described herein can be used to generate any number of parallel output PWM signals.

In the illustrated embodiment, the PWM signal generator 100 includes a sampling module 118, a unit activation module 120, signal generation units 122 and 124 (also referred to herein as "signal generation unit A" and "signal generation unit B," respectively), and a signal combination module 126. The functionality of the various modules of the PWM signal generator 100 as illustrated in FIGS. 1-5 can be implemented as hardware, firmware, one or more processors that execute software representative of the corresponding functionality, or a combination thereof. To illustrate, the functionality of certain components can be implemented as discrete logic, an application specific integrated circuit (ASIC) device, a field programmable gate array (FPGA), and the like.

The sampling module 118 is configured to sample the input signal 101 using a sample clock signal 128 (having a frequency f_smp) to generate PWM parameters 130 for each iteration of the sampling process. In one embodiment, the sample clock signal 128 is generated from a periodic signal 129 (having a frequency f_osc) via a frequency divider 127 having a divide ratio of M such that f_smp=f_osc/M. As described in greater detail below, the PWM parameters 130 determined by the sampling module 118 can include a value N_t that represents the total number of samples taken over a PWM cycle being sampled in the input PWM signal 101 and a value N_h that represents the number of samples taken over the sampled PWM cycle that have a select sample value (e.g., logic "high" or "1" for this example). Thus, the ratio of the value N_h (a measure of the duration of the active portion of the sampled PWM cycle) to the value N_t (a measure of the total duration, or period, of the sampled PWM cycle) represents the duty ratio of the sampled PWM cycle. The sampling module 118 can update these values for each successive PWM cycle of the input PWM signal 101 or for each Xth PWM cycle of the input PWM signal 101 (i.e., by performing the sampling process each successive PWM cycle or for each Xth PWM cycle) or the values for N_h and N_t determined from one PWM cycle of the input PWM signal 101 can be used for generation of PWM cycles for the output PWM signals 111-114 until a certain event, such as the expiration of a timer, the generation of an interrupt, or a power-on reset. Further, because jitter and other noise in the input PWM signal 101 or the sampling signal 128 may introduce improper variation in the resulting PWM parameters 130 from sampled PWM cycle to sampled PWM cycle, a noise filtering technique may be applied to the resulting PWM parameters 130 to reduce or minimize the effect of this noise during the sampling process. An example noise filtering technique well suited for the sampling process of the sampling module 118 is described in U.S. patent application Ser. No. 12/537,443, entitled "Pulse Width Modulation Frequency Conversion" and filed on Aug. 7, 2009.

The unit activation module 120 includes an input to receive the input PWM signal 101 and outputs to provide start signals 131 and 132 (also referred to herein as signals StartA and StartB, respectively). The unit activation module 120, in one embodiment, alternates between asserting the start signal 131 and asserting the start signal 132 at each same-type edge transition (e.g., each low-to-high transition) in the input PWM signal 101 such that, for example, the start signal 131 is asserted in response to the odd rising edges of the input PWM signal 101 and the start signal 132 is asserted in response to the even rising edges of the input PWM signal 101. As such, the start signal 131 serves to signal the starts of odd PWM cycles of the input PWM signal 101 and the start signal 132 serves to signal the starts of the even PWM cycles of the input PWM signal 101.

The signal generation unit 122 includes a frequency divider 134, a counter 136 (also identified herein as "counter A"), and a control module 138 (also identified herein as "control module A"). The frequency divider 134 includes an input to receive the periodic signal 129, an input to receive the start signal 131, an input to receive a stop signal 137 (also identified herein as signal "StopA"), and an output to provide a generation clock signal 135 (having a frequency f_smpA) based on the periodic signal 129. In one embodiment, the frequency divider 134 implements a division ratio M such that the frequency f_smpA=f_osc/M. The frequency divider 134 is configured to initiate and begin generation of the generation clock signal 135 in response to an assertion of the start signal 131 (i.e., in response to the start of an odd cycle of the input PWM signal 101). The counter 136 includes an input to receive the generation clock signal 135, an input to receive the start signal 131, an input to receive the stop signal 137, and an output to provide a count value 139 (also identified herein as "CountA"). The counter 136 is configured to increment the count value CountA for each clock cycle of the generation clock signal 135. The counter 136 stops counting clock cycles and resets its count value CountA in response to an assertion of the stop signal 137. The control module 138 includes inputs to receive the start signal 131, the PWM parameters 130 (e.g., the values N_h and N_t), the count value CountA, and includes outputs to provide the stop signal 137 and a plurality of odd PWM signals 141, 142, 143, and 144 (also identified herein as "PWM1A," "PWM2A," "PWM3A," and "PWM4A," respectively). The control module 138 is configured to time the generation of sets of PWM cycles for the odd PWM signals 141-144 based on the count value CountA and the PWM parameters 130 as described in greater detail below with reference to FIG. 2.

The signal generation unit 124 is configured in a manner similar to that of the signal generation unit 122. As such, the signal generation unit 124 includes a frequency divider 154, a counter 156 (also identified herein as "counter B"), and a control module 158 (also identified herein as "control module B"). The frequency divider 154 includes an input to receive the periodic signal 129, an input to receive the start signal 132, an input to receive a stop signal 157 (also identified herein as signal "StopB"), and an output to provide a generation clock signal 155 (having a frequency f_smpB) based on the periodic signal 129. In one embodiment, the frequency divider 154, like the frequency divider 134, implements a division ratio M such that the frequency f_smpB=f_osc/M. The frequency divider 154 is configured to initiate and begin generation of the generation clock signal 155 in response to an assertion of the start signal 132 (i.e., in response to the start of an even cycle of the input PWM signal 101). The counter 156 includes an input to receive the generation clock signal 155, an input to receive the start signal 132, an input to receive the stop signal 157, and an output to provide a count value 159 (also identified herein as "CountB"). The counter 156 is configured to increment the count value CountB for each clock cycle of the generation clock signal 155 and to stop counting clock cycles and reset its count value CountB in response to an assertion of the stop signal 157. The control module 158 includes inputs to receive the start signal 132, the PWM parameters 130 (e.g., the values N_h and N_t), the count value CountB, and includes outputs to provide the stop signal 157 and a plurality of even PWM signals 161, 162, 163, and 164 (also identified herein as "PWM1B," "PWM2B," "PWM3B," and "PWM4B," respectively). The control module 158 is configured to time the generation of sets of PWM cycles for the even PWM signals 161-164 based on the count value CountB and the PWM parameters 130 as described in greater detail below with reference to FIG. 2.

As noted above, the signal generation unit 122 is configured to independently generate the odd PWM cycles for the output PWM signals 111-114 based on the count value CountA of the counter 136 and the signal generation unit 124 is configured to independently generate the even PWM cycles for the output PWM signals 111-114 based on the count value CountB of the counter 156. Accordingly, the signal combination module 126 combines the odd PWM signals 141-144 generated by the signal generation unit 122 with the even PWM signals 161-164 generated by the signal generation unit 124 to produce the output PWM signals 111-114. To this end, the signal combination module 126 is configured to: combine the odd PWM signal 141 from the control module 138 and the even PWM signal 161 from the control module 158 to generate the output PWM signal 111; combine the odd PWM signal 142 from the control module 138 and the even PWM signal 162 from the control module 158 to generate the output PWM signal 112; combine the odd PWM signal 143 from the control module 138 and the even PWM signal 163 from the control module 158 to generate the output PWM signal 113; and combine the odd PWM signal 144 from the control module 138 and the even PWM signal 164 from the control module 158 to generate the output PWM signal 114. In the illustrated example, the signal combination module 126 can be implemented as OR gates 171-174, whereby: the OR gate 171 receives the odd PWM signal 141 and the even PWM signal 161 and provides the output PWM signal 111; the OR gate 172 receives the odd PWM signal 142 and the even PWM signal 162 and provides the output PWM signal 112; the OR gate 173 receives the odd PWM signal 143 and the even PWM signal 163 and provides the output PWM signal 113; and the OR gate 174 receives the odd PWM signal 144 and the even PWM signal 164 and provides the output PWM signal 114. Although an example implementation using OR gates is illustrated, other signal combination mechanisms can be used without departing from the scope of the present disclosure. The resulting output PWM signals 111-114 then can be provided directly to the one or more PWM-driven components 116, either directly or via corresponding drivers (not shown).

In operation, the sampling module 118 samples successive PWM cycles of the input PWM signal 101 to generate the parameters N_h and N_t for each sampled PWM cycle. As discussed above, the sampling module 118 can use a noise filtering with respect to the determination of the parameters N_h and N_t to reduce the effects of jitter and other sources of noise in the input PWM signal 101. For an odd PWM cycle X of the input PWM signal 101, the signal generation unit 122 is used to time the generation of a corresponding set of odd PWM cycles of the output PWM signals 111-114 (via odd PWM signals 141-144) based on the parameters N_h(X) and N_t(X) determined by the sampling module 118 for the odd input PWM cycle X and based on the count value CountA initiated in response to the start of the even input PWM cycle following the end of the sampled odd input PWM cycle X. In particular, the signal generation unit 122 times the active portion of each generated PWM cycle of the corresponding set of odd output PWM cycles such that the duration of the active portion of each generated output PWM cycle of the set is timed or measured as a change in the count value CountA equal to the value N_h(X) and such that the corresponding phase-shift delay for each generated output PWM cycle of the set is timed or measured as a change in the count value CountA equal to a calculated value associated with the phase-shift delay. To illustrate, in instances whereby the phase-shifting among the output PWM signals is substantially evenly distributed across the entire PWM period, the phase-shift value for each successive output PWM signal can be calculated as an integer multiple of a ratio of the value N_t(X) to the total number of output PWM signals being generated in parallel N_ch (e.g., four output PWM channels in the example of FIG. 1). For example, the phase-shift for channel n can be selected as PSn(X)=(n−1) N_t(X)/N_ch, where n=1, N_ch. In this manner, the signal generation unit 122 directs the generation of the sets of odd PWM cycles for the resulting output PWM signals 111-114 (via odd PWM signals 141-144).

Likewise, for an even PWM cycle Y of the input PWM signal 101, the signal generation unit 124 is used to time the generation of a corresponding set of even PWM cycles of the output PWM signals 111-114 (via even PWM signals 161-164) based on the parameters N_h(Y) and N_t(Y) determined by the sampling module 118 for the even input PWM cycle Y and based on the count value CountB initiated in response to the start of the odd PWM cycle following the even PWM cycle Y in the input PWM signal 101. In particular, the signal generation unit 124 times the active portion of each generated PWM cycle of the corresponding set of even output PWM cycles such that the duration of the active portion is timed or measured as a change in the count value CountB equal to the value N_h(Y) and such that the corresponding phase-shift delay for each generated output PWM cycle of the set is timed or measured as a change in the count value CountB equal to a calculated value representative of the phase-shift delay to be implemented in the output PWM signal. For example, for uniform phase-shift distribution among the output PWM channels, the phase-shift for channel n can be selected as PSn(Y)=(n−1) N_t(Y)/N_ch, where n=1, N_ch. In this manner, the signal generation unit 124 directs the generation of the sets of even PWM cycles for the resulting output PWM signals 111-114 (via even PWM signals 161-164). The signal combination module 126 then combines the sets of odd output PWM cycles (represented by odd PWM signals 141-144) and the sets of even output PWM cycles (represented by even PWM signals 161-164) as described above to generate the output PWM signals 111-114.

FIG. 1 illustrates one embodiment whereby the sample clock signal 128, the generation clock signal 135, and the generation clock signal 155 each is generated via a separate frequency divider (e.g., frequency dividers 127, 134, and 154, respectively). This arrangement permits each of signal generation unit 122 and 124 to initialize and begin timing the generation of a set of PWM cycles relatively immediately following the start of a corresponding PWM cycle of the input PWM signal 101. This approach reduces or minimizes any misalignment between the rising edge of the input PWM signal 101 and the corresponding rising edges of the output PWM signals 111-114.

Figure 2:
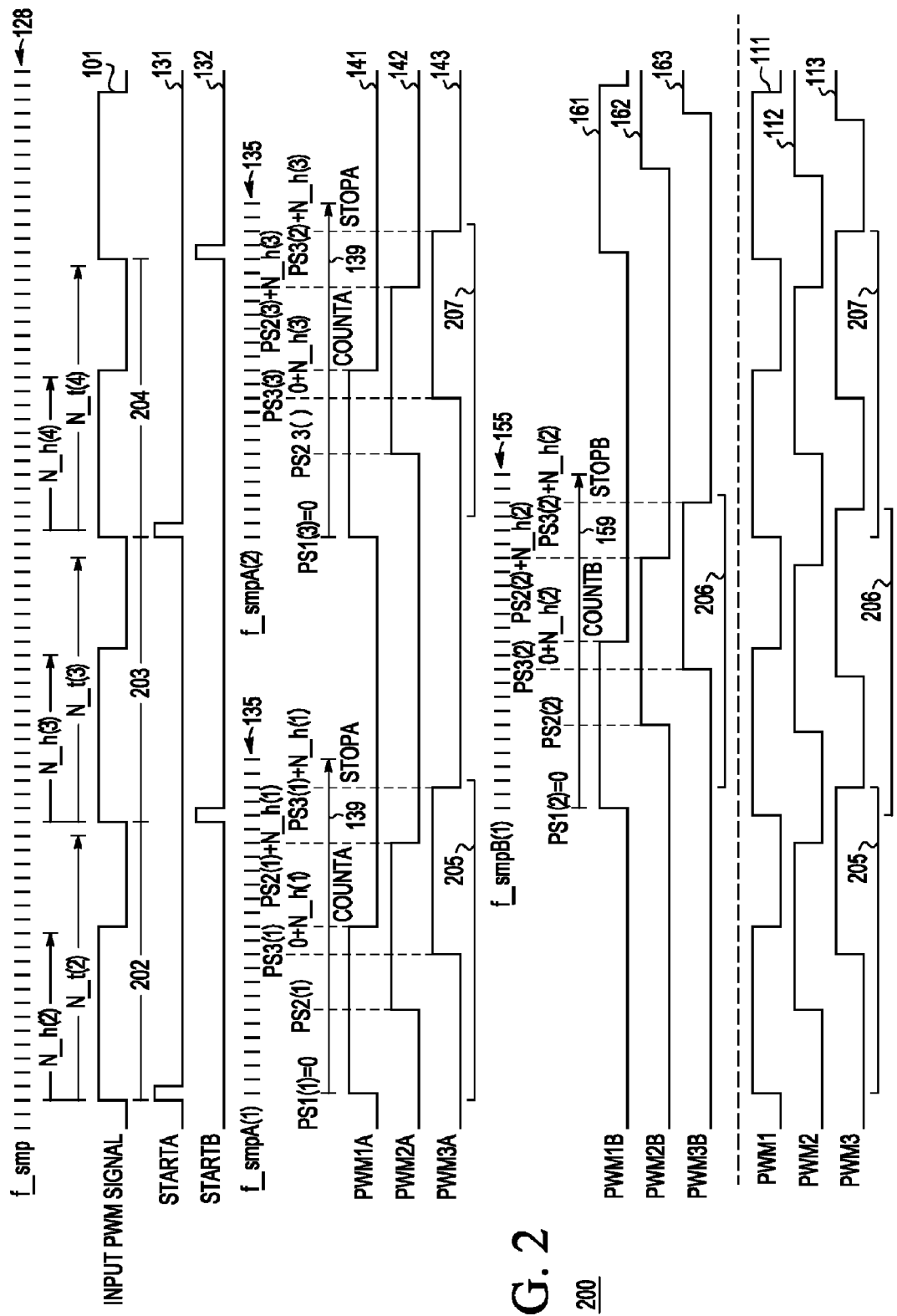
FIG. 2 is a timing diagram illustrating an example operation of the PWM signal generator in accordance with at least one embodiment of the present invention.

FIG. 2 illustrates a timing diagram 200 representative of an example operation of the PWM signal generator 100 of FIG. 1 for generation of three output PWM signals 111-113 in accordance with at least one embodiment of the present disclosure. In the illustrated example, the odd PWM signal 141 and the even PWM signal 161 are combined (e.g., via OR gate 171) to generate the output PWM signal 111, the odd PWM signal 142 and the even PWM signal 162 are combined (e.g., via OR gate 172) to generate the output PWM signal 112, and the odd PWM signal 143 and the even PWM signal 163 are combined (e.g., via OR gate 173) to generate the output PWM signal 113.

Initially in the illustrated example operation, the sampling module 118 samples an initial odd PWM cycle (not shown) of the input PWM signal 101 using the sample clock signal 128 generated from the periodic signal 129 to determine the parameters $N\_h(1)$ and $N\_t(1)$ for the sampled initial odd input PWM cycle. In response to the rising edge of the following even PWM cycle 202 of the input PWM signal 101, the unit activation module 120 asserts the start signal 131 (illustrated as a pulse of the start signal 131), which directs the frequency divider 134 to initialize and begin generation of the generation clock signal 135. The start signal 131 also causes the counter 136 to increment the count value CountA, starting from count value 0, for each cycle of the generation clock signal 135. The control module 138 then uses the count value CountA to time the generation of the phase-shift delays and the active portions of a corresponding set 205 of odd PWM cycles for the odd PWM signals 141-143.

Before timing the PWM cycles of the set 205, the control module 138 calculates various threshold values that serve as timing references for the control module 138 for the phase-shift delays and active portions of the odd PWM cycles of the set 205. As illustrated in FIG. 2, these threshold values include: the phase-shift delay value $PS1(1)$ representing the phase-shift delay to be implemented in the PWM cycle of the set 205 for the output PWM signal 111; the phase-shift delay value $PS2(1)$ representing the phase-shift delay to be implemented in the PWM cycle of the set 205 for the output PWM signal 112; and the phase-shift delay value $PS3(1)$ representing the phase-shift delay to be implemented in the PWM cycle of the set 205 for the output PWM signal 113. The phase-shift delay for each output PWM signal may be substantially equal or different phase-shift delays can be implemented for some or all of the output PWM signals 111-113. In instances whereby the phase-shift delays are substantially equal and substantially equally distributed over the entire PWM cycle period, the phase-shift delay for each output PWM signal can be calculated as an integer multiple of a ratio of the value $N\_t$ (representing the duration of the PWM cycle) to $N\_ch$ (representing the number of output PWM signals to be generated), e.g., $PSn(X)=(n-1) N\_t(X)/N\_ch$, $n=1, N\_ch$. In the example of FIG. 2, the output PWM signal 111 is not phase shifted relative to the input PWM signal 101 (i.e., $PS1(X)=0$), and phase shift delay $PS3(X)$ for the output PWM signal 113 is greater than the phase shift delay $PS2(X)$ for the output PWM signal 112.

The threshold values calculated by the control module 138 further include timing references for the end of the active portions of the odd PWM cycles of the set 205, including: $PS1(1)+N\_h(1)$ (or $0+N\_h(1)$) to mark the end of the active portion of the PWM cycle of the set 205 for the odd PWM signal 141; $PS2(1)+N\_h(1)$ to mark the end of the active portion of the PWM cycle of the set 205 for the odd PWM signal 142; and $PS3(1)+N\_h(1)$ to mark the end of the active portion of the PWM cycle of the set 205 for the odd PWM signal 143. The control module 138 further calculates the threshold value $StopA(1)$ for the counter 136, which is an event after the timing of the generation of the PWM cycles of the set 205 has concluded. The threshold value $StopA(1)$ is calculated as some value equal to or greater than the threshold value used to mark the end of the last active portion of the PWM cycles in the set 205. To illustrate, the control module 138 may calculate the threshold value $StopA(1)$ as $PS3(1)+N\_h(1)+K$, whereby K can be zero or a small positive value. K typically is selected to be small enough such that frequency divider 134 and counter A 136 are reset and ready to use before the rising edge of the next even input PWM cycle.

As noted above, the frequency divider 134 initiates with the assertion of the start signal 131 at the rising edge of the PWM cycle 202 and the count value CountA increments in response to each cycle of the generation clock signal 135 thereafter. As the count value CountA reaches each threshold value, the control module 138 takes a corresponding action with respect to the generation of the active portions of the PWM cycles of the set 205. To illustrate, as the phase-shift delay PS1 is zero for the output PWM signal 111, the control module 138 immediately drives the odd PWM signal 141 high (i.e., configures the odd PWM signal 141 to a high level) in response to the assertion of the start signal 131 at the rising edge of the PWM cycle 202 of the input PWM signal 101, and thus initiating the active portion of the first PWM cycle for the output PWM signal 111. When the count value CountA reaches the value $PS2(1)$ representing the phase-shift delay for the output PWM signal 112, the control module 138 drives the odd PWM signal 142 high, and thus initiating the active portion of the first PWM cycle for the output PWM signal 112. When the count value CountA reaches the value $PS3(1)$ representing the phase-shift delay for the output PWM signal 113, the control module 138 drives the odd PWM signal 143 high, and thus initiating the active portion of the first PWM cycle for the output PWM signal 113. When the count value CountA reaches the value $PS1(1)+N\_h(1)$ (or $0+N\_h(1)$), the control module 138 ceases driving the odd PWM signal 141 high (i.e., reconfigures the odd PWM signal 141 to a low level), thereby terminating the active portion of the first PWM cycle for the output PWM signal 111. When the count value CountA reaches the value $PS2(1)+N\_h(1)$, the control module 138 ceases driving the odd PWM signal 142 high, thereby terminating the active portion of the first PWM cycle for the output PWM signal 112. When the count value CountA reaches the value $PS3(1)+N\_h(1)$, the control module 138 ceases driving the odd PWM signal 143 high, thereby terminating the active portion of the first PWM cycle for the output PWM signal 113. When the count value CountA reaches the value $StopA(1)$, the control module 138 asserts the stop signal 137, thereby directing the counter 136 to cease counting clock cycles of the generation clock signal 135 and to reset the count value CountA. The stop signal 137 also stops the frequency divider 134 and resets the frequency divider 134 to a state waiting for an assertion of the start signal 131 so as to start the generation of the generation clock 135 again. As a result, the phase of the generation clock 135 after being restarted (e.g., for set 207) is not necessary the same as the phase of the previously-started generation clock 135 (e.g., for set 205). Further, the phase of the generation clock 135 is not necessarily the same as the phase of the sample clock 128 or the same phase of the generation clock 155, or vice versa.

The signal generation unit 124 operates in a similar manner for timing the generation of PWM cycles of set 206 for the even PWM signals 161-163. The sampling module 118 samples the even PWM cycle 202 of the input PWM signal 101 to determine the parameters $N\_h(2)$ and $N\_t(2)$. The control module 158 receives these parameters and calculates the threshold values to time the generation of the PWM cycles of the set 206 relative to the count value CountB. These threshold values include: the phase-shift delay value $PS1(2)$ representing the phase-shift delay to be implemented in the PWM cycle of the set 206 for the PWM signal 111; the phase-shift delay value $PS2(2)$ representing the phase-shift delay to be implemented in the PWM cycle of the set 206 for the PWM signal 112; and the phase-shift delay value $PS3(2)$ representing the phase-shift delay to be implemented in the PWM cycle of the set 206 for the PWM signal 113. The threshold values calculated by the control module 158 for timing the set 206 further include timing references for the ends of the active portions of the PWM cycles of the set 206, including: PS1(2)+N_h(2) (or 0+N_h(2)) to mark the end of the active portion of the PWM cycle of the set 206 for the even PWM signal 161; PS2(2)+N_h(2) to mark the end of the active portion of the PWM cycle of the set 206 for the even PWM signal 162; and PS3(2)+N_h(2) to mark the end of the active portion of the PWM cycle of the set 206 for the even PWM signal 163. The control module 158 further calculates the threshold value StopB(2) for the counter 156, which is an event after the timing of the generation of the PWM cycles of the set 206 has concluded, whereby the threshold value StopB (2) is calculated as some value equal to or greater than the threshold value used to mark the end of the last active portion of the PWM cycles in the set 206, such as StopB(2)=PS3(2)+ N_h(2)+K. As noted above, the value for K typically is selected so as to be small enough such that frequency divider 154 and counter B 156 are reset and are ready to use before the next rising edge of the odd input PWM cycle.

The frequency divider 154 initiates with the assertion of the start signal 132 at the rising edge of the input PWM cycle 203 and begins generation of the generation clock signal 155. The corresponding assertion of the start signal 132 also causes the counter 156 to increment the count value CountB, starting from count value 0, in response to the cycles of the resulting generation clock signal 155. As the count value CountB reaches each threshold value, the control module 158 takes a corresponding action with respect to the generation of the active portions of the PWM cycles of the set 206. To illustrate, as the phase-shift delay PS1 is zero for the output PWM signal 111, the control module 158 immediately drives the even PWM signal 161 high (i.e., configures the even PWM signal 161 to a high level) in response to the assertion of the start signal 132 at the rising edge of the PWM cycle 203 of the input PWM signal 101, and thus initiating the active portion of the second PWM cycle for the output PWM signal 111. When the count value CountB reaches the value PS2(2) representing the phase-shift delay for the output PWM signal 112, the control module 158 drives the even PWM signal 162 high, and thus initiating the active portion of the second PWM cycle for the output PWM signal 112. When the count value CountB reaches the value PS3(2) representing the phase-shift delay for the output PWM signal 113, the control module 158 drives the even PWM signal 163 high, and thus initiating the active portion of the second PWM cycle for the output PWM signal 113. When the count value CountB reaches the value PS1(2)+N_h(2) (or 0+N_h(2)), the control module 158 ceases driving the even PWM signal 161 high (i.e., reconfigures the even PWM signal 161 to a low level), thereby terminating the active portion of the second PWM cycle for the output PWM signal 111. When the count value CountB reaches the value PS2(2)+N_h(2), the control module 158 ceases driving the even PWM signal 162 high, thereby terminating the active portion of the second PWM cycle for the output PWM signal 112. When the count value CountB reaches the value PS3(2)+N_h(2), the control module 158 ceases driving the even PWM signal 163 high, thereby terminating the active portion of the second PWM cycle for the output PWM signal 113. When the count value CountB reaches the value StopB(2), the control module 158 asserts the stop signal 157, thereby directing the counter 156 to cease counting clock cycles of the generation clock signal 155 and to reset the count value CountB. The assertion of the stop signal 157 also stops the frequency divider 154 and resets the frequency divider 154 to a state waiting for an assertion of the start signal 132 to start the generation of the generation clock signal 155 again. Thus, as with the generation clock signal 135, the phase of the generation clock signal 155 after being started a second time is not necessary the same as the phase of the generation clock signal 155 after being started the first time, nor does the generation clock signal 155 necessarily have the same phase of either the sample clock 128 or the generation clock signal 135, or vice versa.

While the signal generation unit 124 is generating the set 206 of PWM cycles, the sampling module 118 samples the PWM cycle 203 of the input PWM signal 101 to determine the parameters N_h(3) and N_t(3) for the sampled PWM cycle 203. The control module 138 of the signal generation unit 122 then may use the parameters N_h(3) and N_t(3) to calculate the appropriate threshold values to time the generation of active portions of a set 207 of PWM cycles in the odd PWM signals 141-143 responsive to the start of the even input PWM cycle 204 and then take the appropriate actions with respect to driving the odd PWM signals 141-143 as similarly described above with respect to the generation of the PWM cycles of the set 205 by the signal generation unit 122. Further, while the signal generation unit 122 is generating the set 207 of PWM cycles, the sampling module 118 samples the input PWM cycle 204 to determine the parameters N_h(4) and N_t(4) for the sampled PWM cycle 204, which then may be used by the signal generation unit 124 to time the generation of another set of even PWM cycles based on the count value CountB initiated at the start of the next PWM cycle following the PWM cycle 204. This process of interleaving sets of PWM cycles generated by the signal generation unit 122 using the counter 136 with sets of PWM cycles generated by the signal generation unit 124 using the counter 156 can continue for one or more PWM cycles of the input PWM signal 101.

As depicted in FIG. 1, the signal generation units 122 and 124 implement control modules to control the generation of the respective even and odd PWM signals based on the threshold values calculated from the PWM parameters and the desired phase-shift delays. In one embodiment, the control modules can be implemented as state machines to implement the PWM signal generation processes described above. In an alternate embodiment, each signal generation unit can be implemented as combinational logic, such as logic including a plurality of digital comparators, each digital comparator having one input to receive the respective count value, one input to receive a corresponding threshold value, and an output that is asserted when the received count value reaches the received threshold value. The output signals of the digital comparators then may be used by control logic or another mechanism to control the generation of the respective PWM signals as described above. The control modules also may be implemented as a combination of state machines and combinational logic.

Figure 3:
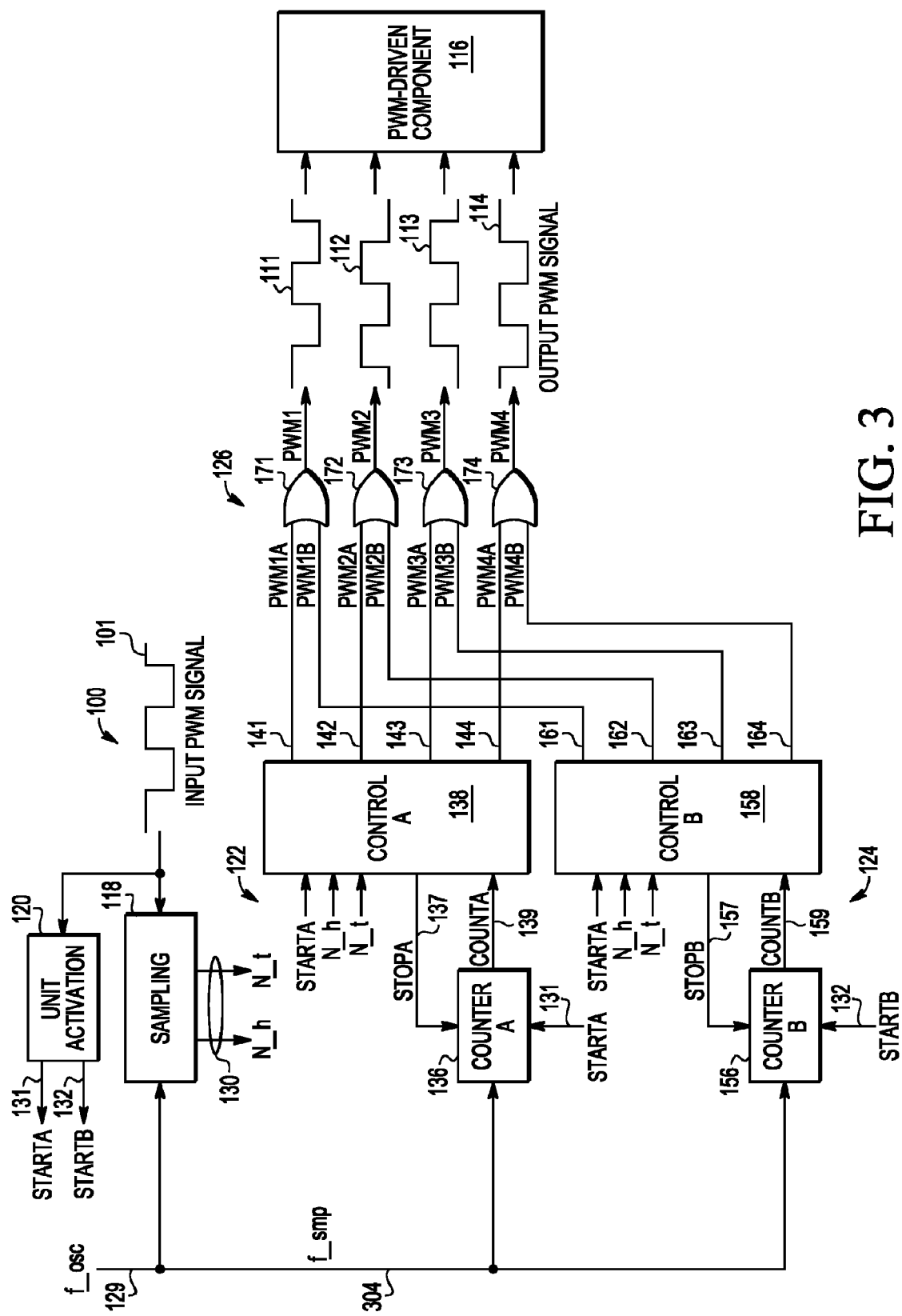
FIG. 3 is a diagram illustrating an alternate implementation of a PWM signal generator in accordance with at least one embodiment of the present invention.

FIG. 3 illustrates an alternate implementation of the PWM signal generator 100 in accordance with at least one embodiment of the present disclosure. Rather than implement a separate frequency divider to generate separate signals for the sampling module 118, the signal generation unit 122 and the signal generation unit 124, the implementation illustrated in FIG. 3 uses a single clock signal 304 that may be used in place of the sample clock signal 128, the generation clock signal 135, and the generation clock signal 155 in the operation of the PWM signal generator 100. This approach can reduce cost and complexity as only one clock signal is needed. However, while the duty ratio and the phase relationships can be substantially maintained, this approach introduces a potential misalignment between the edges of the input PWM signal 101 and the corresponding edges of the output PWM signals 111-114 that can potentially be as great at the period of the shared clock signal, which may be acceptable depending on the intended application.

Figure 4:
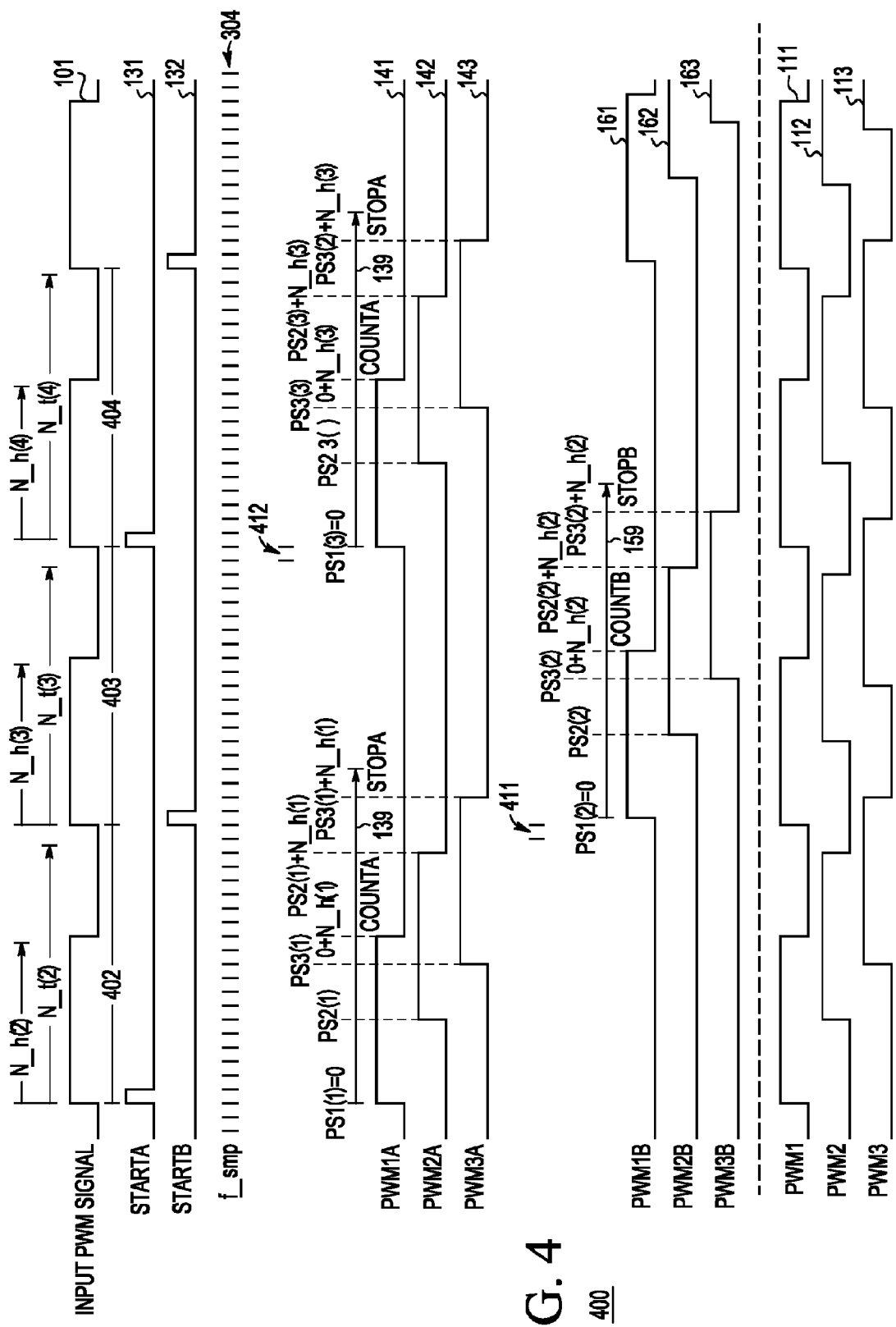
FIG. 4 is a timing diagram illustrating an example operation of the PWM signal generator of FIG. 3 in accordance with at least one embodiment of the present invention.

To illustrate, FIG. 4 illustrates a timing diagram 400 representative of an example operation of the alternate implementation of the PWM signal generator 100 using a single frequency to provide the same clock signal 304 to each of the sampling module 118, the signal generation unit 122, and the signal generation unit 124. As illustrated in FIG. 4, by using the single clock signal 304 to time the generation of both even and odd PWM cycles, a potential misalignment is introduced between the rising edge of the input PWM cycle of the input PWM signal 101 and the corresponding rising edges of the output PWM cycles. For example, because the rising edge marking the start of the input PWM cycle 403 of the input PWM signal 101 does not coincide with an active edge of the clock signal 304, the initiation of the generation of the corresponding set of output PWM cycles is delayed by a misalignment duration 411 until the next active edge of the clock signal 304 following the rising edge of the input PWM cycle 403. Likewise, a misalignment duration 412 is introduced between the rising edge of the input PWM cycle 404 and the rising edges of the corresponding output PWM cycles due to the use of the same clock signal 304. However, as noted above, this misalignment may be acceptable in view of the timing requirements of the system in which the PWM signal generator is implemented, particularly considering the advantage of needing only one clock signal.

Figure 5:
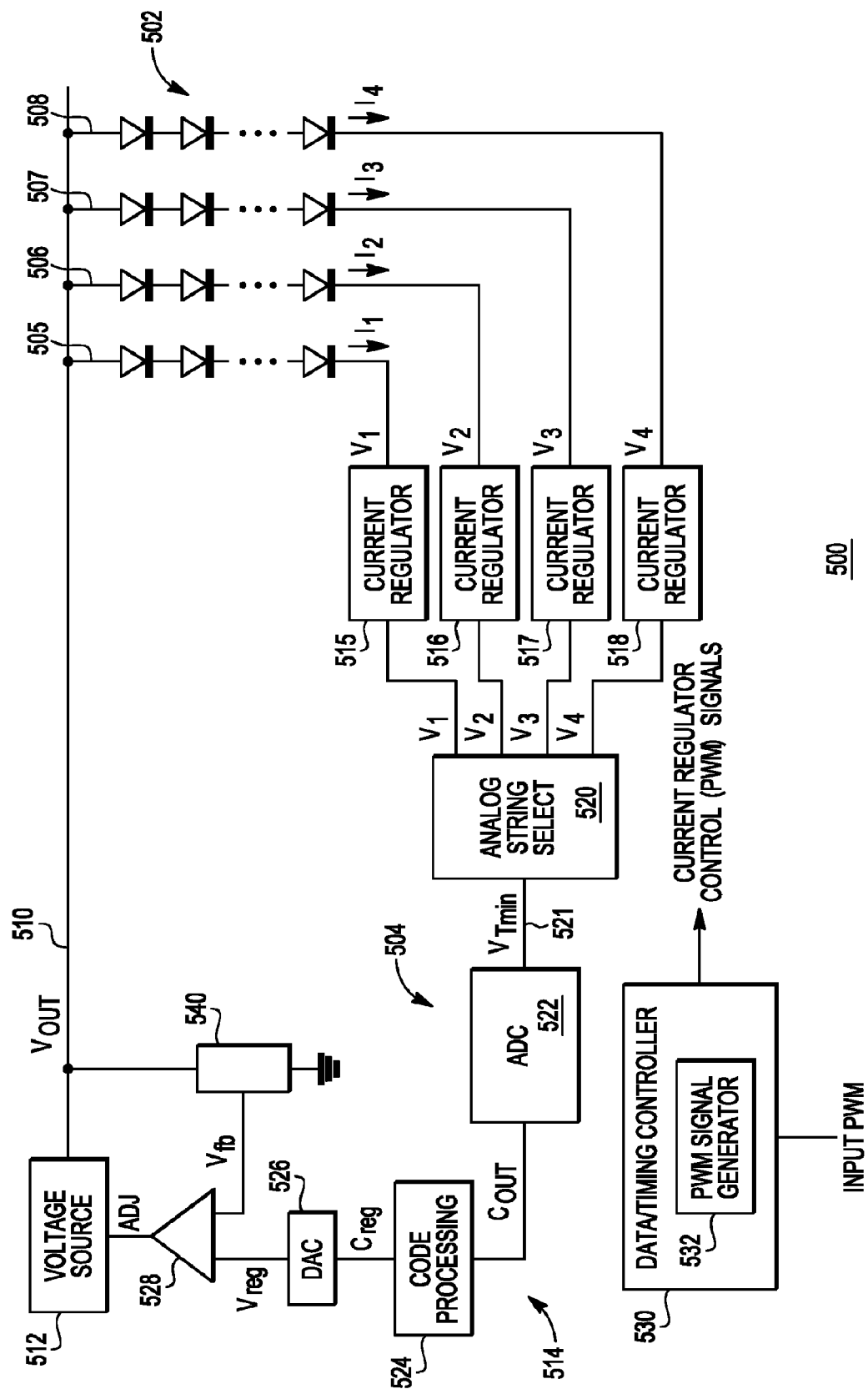
FIG. 5 is a diagram illustrating an example light emitting diode (LED) system implementing the PWM signal generator of FIG. 1 in accordance with at least one embodiment of the present invention.

FIG. 5 illustrates an example implementation of the PWM signal generator 100 of FIGS. 1 and 3 for dynamic power management in a light emitting diode (LED) system 500 having a plurality of LED strings. The term "LED string," as used herein, refers to a grouping of one or more LEDs connected in series. The "head end" of a LED string is the end or portion of the LED string which receives the driving voltage/current and the "tail end" of the LED string is the opposite end or portion of the LED string. The term "tail voltage," as used herein, refers the voltage at the tail end of a LED string or representation thereof (e.g., a voltage-divided representation, an amplified representation, etc.). The term "subset of LED strings" refers to one or more LED strings.

In the depicted example, the LED system 500 includes a LED panel 502 and a LED driver 504. The LED panel 502 includes a plurality of LED strings (e.g., LED strings 505, 506, 507, and 508). Each LED string includes one or more LEDs 509 connected in series. The LEDs 509 can include, for example, white LEDs, red, green, blue (RGB) LEDs, organic LEDs (OLEDs), etc. Each LED string is driven by the adjustable voltage $V_{OUT}$ received at the head end of the LED string from a voltage source 512 of the LED driver 504 via a voltage bus 510 (e.g., a conductive trace, wire, etc.). In the embodiment of FIG. 5, the voltage source 512 is implemented as a boost converter configured to drive the output voltage $V_{OUT}$ using a supplied input voltage.

The LED driver 504 includes a feedback controller 514 configured to control the voltage source 512 based on the tail voltages at the tail ends of the LED strings 505-508. The LED driver 504, in one embodiment, receives an input PWM signal 501 (corresponding to input PWM signal 101) identifying the duty ratio at which the LED strings 505-508 are to be driven, and the LED driver 504 is configured to activate the LED strings 505-508 based on the input PWM signal 101.

The feedback controller 514, in one embodiment, includes a plurality of current regulators (e.g., current regulators 515, 516, 517, and 518), an analog string select module 520, an ADC 522, a code processing module 524, a control digital-to-analog converter (DAC) 526, an error amplifier 528, and a data/timing controller 530. The data/timing controller 530 includes a PWM signal generator 532 (corresponding to the PWM signal generator 100, FIG. 1).

The current regulator 515 is configured to maintain the current $I_1$ flowing through the LED string 505 at or near a fixed current (e.g., 50 mA) when active. Likewise, the current regulators 516, 517, and 518 are configured to maintain the currents $I_2$, $I_3$, and $I_4$ flowing through the LED strings 506, 507, and 508, respectively, at or near the fixed current when active.

A current regulator typically operates more effectively when the input of the current regulator is a non-zero voltage so as to accommodate the variation in the input voltage that often results from the current regulation process of the current regulator. This buffering voltage often is referred to as the "headroom" of the current regulator. As the current regulators 515-518 are connected to the tail ends of the LED strings 505-508, respectively, the tail voltages of the LED strings 505-508 represent the amounts of headroom available at the corresponding current regulators 515-518. However, headroom in excess of that necessary for current regulation purposes results in unnecessary power consumption by the current regulator. Accordingly, as described in greater detail herein, the LED system 500 employs techniques to provide dynamic headroom control so as to maintain the minimum tail voltage of the active LED strings at or near a predetermined threshold voltage, thus maintaining the lowest headroom of the current regulators 515-518 at or near the predetermined threshold voltage. The threshold voltage can represent a determined balance between the need for sufficient headroom to permit proper current regulation by the current regulators 515-518 and the advantage of reduced power consumption by reducing the excess headroom at the current regulators 515-518.

The data/timing controller 530 receives the input PWM signal 501. The PWM signal generator 532 then generates a set of four output PWM signals in accordance with the techniques described above. Each output PWM signal is provided to a corresponding current regulator to control the activation of the corresponding LED strings. Using the PWM signal generation techniques described above, the output PWM signals can be synchronized to the input PWM signal 501, and thus can reduce or eliminate the potential for visual noise due to frequency beating between the frame frequency, the PWM frequency, and their harmonics. Likewise, as the output PWM signals are phase shifted relative to each other, the potential for ripple in the voltage $V_{OUT}$ provided by the voltage source 512 can be reduced, as can audible noise and visual flickering that could otherwise occur if all of the LED strings were to be activated and deactivated simultaneously.

The analog string select module 520 includes a plurality of tail inputs coupled to the tail ends of the LED strings 505-508 to receive the tail voltages $V_{T1}$, $V_{T2}$, $V_{T3}$, and $V_{T4}$ of the LED strings 505-508, respectively, and an output to provide an analog signal 521 representative of the minimum tail voltage $V_{Tmin}$ of the LED strings 505-508 at any given point over a detection period. In one embodiment, the analog string select module 520 is implemented as a diode-OR circuit having a plurality of inputs connected to the tail ends of the LED strings 505-508 and an output to provide the analog signal 521.

The ADC 522 is configured to generate one or more digital code values $C_{OUT}$ representative of the voltage of the analog signal 521 at one or more corresponding sample points. The code processing module 524 includes an input to receive the one or more code values $C_{OUT}$ and an output to provide a code value $C_{reg}$ based on the minimum value of the received code values $C_{OUT}$ for a given detection period or a previous value for $C_{reg}$ from a previous detection period. As the code value $C_{OUT}$ represents the minimum tail voltage that occurred during the detection period (e.g., a PWM cycle, a display frame period, etc.) for all of the LED strings 505-508, the code processing module 524, in one embodiment, compares the code value $C_{OUT}$ to a threshold code value, $C_{thresh}$, and generates a code value $C_{reg}$ based on the comparison. The code processing module 524 can be implemented as hardware, software executed by one or more processors, or a combination thereof. To illustrate, the code processing module 524 can be implemented as a logic-based hardware state machine, software executed by a processor, and the like.

The control DAC 526 includes an input to receive the code value $C_{reg}$ and an output to provide a regulation voltage $V_{reg}$ representative of the code value $C_{reg}$. The regulation voltage $V_{reg}$ is provided to the error amplifier 528. The error amplifier 528 also receives a feedback voltage $V_{fb}$ representative of the output voltage $V_{OUT}$. In the illustrated embodiment, a voltage divider 540 is used to generate the voltage $V_{fb}$ from the output voltage $V_{OUT}$. The error amplifier 528 compares the voltage $V_{fb}$ and the voltage $V_{reg}$ and configures a signal ADJ based on this comparison. The voltage source 512 receives the signal ADJ and adjusts the output voltage $V_{OUT}$ based on the magnitude of the signal ADJ.

There may be considerable variation between the voltage drops across each of the LED strings 505-508 in the LED system 500 due to static variations in forward-voltage biases of the LEDs 509 of each LED string and dynamic variations due to the on/off cycling of the LEDs 509. Thus, there may be significant variance in the bias voltages needed to properly operate the LED strings 505-508. However, rather than drive a fixed output voltage $V_{OUT}$ that is substantially higher than what is needed for the smallest voltage drop as this is handled in conventional LED drivers, the LED driver 504 illustrated in FIG. 5 utilizes a feedback mechanism that permits the output voltage $V_{OUT}$ to be adjusted so as to reduce or minimize the power consumption of the LED driver 504 in the presence of variances in voltage drop across the LED strings 505-508. Further, by phase-shifting the output PWM signals used to drive the LED strings 505-508, the LED drivers 504 can experience less voltage ripple at the output voltage $V_{OUT}$, as well as reduce or eliminate audible and visual noise.

In accordance with one aspect, a method for a pulse width modulation (PWM) signal generator is provided. The PWM signal generator receives an input PWM signal and outputs a plurality of output PWM signals in parallel, each output PWM signal phase-shifted in relation to the other output PWM signals. The method includes sampling, at the PWM signal generator, a first PWM cycle of the input PWM signal based on a periodic signal to generate PWM parameters representative of a duration of an active portion of the first PWM cycle and a total duration of the first PWM cycle. The method further includes initiating a first count of a first counter of the PWM signal generator responsive to a start of a second PWM cycle of the input PWM signal, the second PWM cycle following the first PWM cycle and timing, at the PWM signal generator, a generation of a first set of PWM cycles for the plurality of output PWM signals based on the PWM parameters and the first count. The method also includes initiating a second count of a second counter of the PWM signal generator responsive to a start of a third PWM cycle of the input PWM signal, the third cycle following the second PWM cycle and timing, at the PWM signal generator, a generation of a second set of PWM cycles for the plurality of output PWM signals based on the second count.

In one embodiment, the method further includes sampling, at the PWM signal generator, the second PWM cycle based on the periodic signal to generate second PWM parameters representative of a duration of an active portion of the second PWM cycle and a total duration of the second PWM cycle, and wherein timing the generation of the second set of PWM cycles comprises timing the generation of the second set of PWM cycles further based on the second PWM parameters.

Further, in one embodiment, the first counter is driven by a first generation clock signal provided by a first frequency divider, the second counter is driven by a second generation clock signal provided by a second frequency divider, and the method further includes initiating the first frequency divider in response to the start of the second PWM cycle, and initiating the second frequency divider in response to the start of the third PWM cycle. The first frequency divider and the second frequency divider can implement the same frequency division ratio. In an alternate embodiment, the first counter and the second counter are driven by the same clock signal.

In one embodiment, timing the generation of the first set of PWM cycles for the plurality of output PWM signals includes determining, at the PWM signal generator, a first threshold value representative of a first phase-shift delay for a first output PWM signal and determining, at the PWM signal generator, a second threshold value representative of a sum of the first phase-shift delay and the duration of the active portion of the first PWM cycle. In this embodiment, timing the generation of the first set of PWM cycles further includes configuring, at the PWM signal generator, the first output PWM signal to an active level in response to the first count reaching the first threshold value, and reconfiguring, at the PWM signal generator, the first output PWM signal to an inactive level in response to the first count reaching the second threshold value. This timing further can include determining, at the PWM signal generator, a third threshold value representative of a second phase-shift delay for a second output PWM signal, determining, at the PWM signal generator, a fourth threshold value representative of a sum of the second phase-shift delay and the duration of the active portion of the first PWM cycle, configuring, at the PWM signal generator, the second output PWM signal to the active level in response to the first count reaching the third threshold value, and reconfiguring, at the PWM signal generator, the second output PWM signal to the inactive level in response to the first count reaching the fourth threshold value. In one embodiment, the first phase-shift delay is zero and the second phase-shift delay is non-zero. In one aspect, the second phase-shift delay is an integer multiple of the first phase-shift delay and the method further includes determining, at the PWM signal generator, the first phase-shift delay and the second phase-shift delay based on a ratio of a value representative of the total duration of the first PWM cycle and a number of output PWM channels of the plurality of PWM channels. Further, timing the generation of the second set of PWM cycles for the plurality of output PWM signals can include determining, at the PWM signal generator, a third threshold value representative of a second phase-shift delay for the first output PWM signal, determining, at the PWM signal generator, a fourth threshold value representative of a sum of the second phase-shift delay and a duration of an active portion of a second PWM cycle of the input PWM signal, configuring, at the PWM signal generator, the first output PWM signal to an active level in response to the second count reaching the third threshold value, and reconfiguring, at the PWM signal generator, the first output PWM signal to an inactive level in response to the second count reaching the fourth threshold value.

In accordance with another aspect of the present disclosure, a system is provided. The system includes a pulse width modulation (PWM) signal generator having an input to receive an input PWM signal and a plurality of outputs to provide a plurality of output PWM signals in parallel, each output PWM signal phase-shifted in relation to the other output PWM signals. The PWM signal generator includes a sampling module to sample a first PWM cycle of the input PWM signal based on a periodic signal to generate PWM parameters representative of a duration of an active portion of the first PWM cycle and a total duration of the first PWM cycle. The PWM signal generator further includes a first signal generation unit comprising a first counter. The first signal generation unit is to: initiate a first count of the first counter responsive to a start of a second PWM cycle of the input PWM signal, the second PWM cycle following the first PWM cycle; and time a generation of a first set of PWM cycles for the plurality of output PWM signals based on the PWM parameters and the first count. The PWM signal generator further includes a second signal generation unit comprising a second counter. The second signal generation unit is to: initiate a second count of the second counter responsive to a start of a third PWM cycle of the input PWM signal, the third PWM cycle following the second PWM cycle; and time a generation of a second set of PWM cycles for the plurality of output PWM signals based on the second count. In one embodiment, the system further can include a plurality of light emitting diode (LED) strings, each LED string comprising an input to receive a corresponding output PWM signal of the plurality of output PWM signals.

In one embodiment, the sampling module further is to sample the second PWM cycle based on the periodic signal to generate second PWM parameters representative of a duration of an active portion of the second PWM cycle and a total duration of the second PWM cycle, and the second signal generation unit is to time the generation of the second set of PWM cycles further based on the second PWM parameters.

In one embodiment, the system further includes a first frequency divider to generate a first generation clock signal to drive the first counter and a second frequency divider to generate a second generation clock signal to drive the second counter, and wherein the first signal generation unit initiates the first frequency divider in response to the start of the second PWM cycle, and wherein the second signal generation unit initiates the second frequency divider in response to the start of the third PWM cycle.

In one embodiment, the first signal generation unit times the generation of the first set of PWM cycles by determining a first threshold value representative of a first phase-shift delay for a first output PWM signal, determining a second threshold value representative of a sum of the first phase-shift delay and the duration of the active portion of the first PWM cycle, configuring the first output PWM signal to an active level in response to the first count reaching the first threshold value, and reconfiguring the first output PWM signal to an inactive level in response to the first count reaching the second threshold value. In one embodiment, the second signal generation unit times the generation of the second set of PWM cycles by determining a third threshold value representative of a second phase-shift delay for the first output PWM signal, determining a fourth threshold value representative of a sum of the second phase-shift delay and a duty period of a second PWM cycle of the input PWM signal, configuring the first output PWM signal to an active level in response to the second count reaching the third threshold value, and reconfiguring the first output PWM signal to an inactive level in response to the second count reaching the fourth threshold value. In this case, the PWM signal generator further includes a signal combination module having a first input to receive a first representation of the first output PWM signal from the first signal generation unit, a second input to receive a second representation of the first output PWM signal from the second signal generation unit, and an output to provide a combination of the first representation and the second representation as the first output PWM signal. The signal combination module can include an OR gate having the first input, the second input, and the output.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

What is claimed is:

1. In a pulse width modulation (PWM) signal generator that receives an input PWM signal and outputs a plurality of output PWM signals in parallel, each output PWM signal phase-shifted in relation to the other output PWM signals, a method comprising:
   sampling, at the PWM signal generator, a first PWM cycle of the input PWM signal based on a periodic signal to generate PWM parameters representative of a duration of an active portion of the first PWM cycle and a total duration of the first PWM cycle;
   initiating a first count of a first counter of the PWM signal generator responsive to a start of a second PWM cycle of the input PWM signal, the second PWM cycle following the first PWM cycle;
   timing, at the PWM signal generator, a generation of a first set of PWM cycles for the plurality of output PWM signals based on the PWM parameters and the first count;
   initiating a second count of a second counter of the PWM signal generator responsive to a start of a third PWM cycle of the input PWM signal, the third cycle following the second PWM cycle; and
   timing, at the PWM signal generator, a generation of a second set of PWM cycles for the plurality of output PWM signals based on the second count.

2. The method of claim 1, further comprising:
   sampling, at the PWM signal generator, the second PWM cycle based on the periodic signal to generate second PWM parameters representative of a duration of an active portion of the second PWM cycle and a total duration of the second PWM cycle; and
   wherein timing the generation of the second set of PWM cycles comprises timing the generation of the second set of PWM cycles further based on the second PWM parameters.

3. The method of claim 1, wherein:
   the first counter is driven by a first generation clock signal provided by a first frequency divider;
   the second counter is driven by a second generation clock signal provided by a second frequency divider; and
   the method further comprises:
     initiating the first frequency divider in response to the start of the second PWM cycle; and
     initiating the second frequency divider in response to the start of the third PWM cycle.

4. The method of claim 3, wherein the first frequency divider and the second frequency divider each includes an input to receive the periodic signal and implements the same frequency division ratio.

5. The method of claim 1, wherein:
the first counter and the second counter are driven by the same clock signal.

6. The method of claim 1, wherein timing the generation of the first set of PWM cycles for the plurality of output PWM signals comprises:
determining, at the PWM signal generator, a first threshold value representative of a first phase-shift delay for a first output PWM signal;
determining, at the PWM signal generator, a second threshold value representative of a sum of the first phase-shift delay and the duration of the active portion of the first PWM cycle;
configuring, at the PWM signal generator, the first output PWM signal to an active level in response to the first count reaching the first threshold value; and
reconfiguring, at the PWM signal generator, the first output PWM signal to an inactive level in response to the first count reaching the second threshold value.

7. The method of claim 6, wherein timing the generation of the first set of PWM cycles for the plurality of output PWM signals further comprises:
determining, at the PWM signal generator, a third threshold value representative of a second phase-shift delay for a second output PWM signal;
determining, at the PWM signal generator, a fourth threshold value representative of a sum of the second phase-shift delay and the duration of the active portion of the first PWM cycle;
configuring, at the PWM signal generator, the second output PWM signal to the active level in response to the first count reaching the third threshold value; and
reconfiguring, at the PWM signal generator, the second output PWM signal to the inactive level in response to the first count reaching the fourth threshold value.

8. The method of claim 7, wherein the first phase-shift delay and the second phase-shift delay comprise the same phase-shift delay.

9. The method of claim 6, wherein the first phase-shift delay is zero and the second phase-shift delay is non-zero.

10. The method of claim 6, wherein timing the generation of the second set of PWM cycles for the plurality of output PWM signals comprises:
determining, at the PWM signal generator, a third threshold value representative of a second phase-shift delay for the first output PWM signal;
determining, at the PWM signal generator, a fourth threshold value representative of a sum of the second phase-shift delay and a duration of an active portion of a second PWM cycle of the input PWM signal;
configuring, at the PWM signal generator, the first output PWM signal to an active level in response to the second count reaching the third threshold value; and
reconfiguring, at the PWM signal generator, the first output PWM signal to an inactive level in response to the second count reaching the fourth threshold value.

11. The method of claim 6, wherein the second phase-shift delay is an integer multiple of the first phase-shift delay, the method further comprising:
determining, at the PWM signal generator, the first phase-shift delay and the second phase-shift delay based on a ratio of a value representative of the total duration of the first PWM cycle and a number of output PWM channels of the plurality of PWM channels.

12. A system comprising:
a pulse width modulation (PWM) signal generator having an input to receive an input PWM signal and a plurality of outputs to provide a plurality of output PWM signals in parallel, each output PWM signal phase-shifted in relation to the other output PWM signals, the PWM signal generator comprising:
a sampling module to sample a first PWM cycle of the input PWM signal based on a periodic signal to generate PWM parameters representative of a duration of an active portion of the first PWM cycle and a total duration of the first PWM cycle;
a first signal generation unit comprising a first counter, wherein the first signal generation unit initiates a first count of the first counter responsive to a start of a second PWM cycle of the input PWM signal, the second PWM cycle following the first PWM cycle, and times a generation of a first set of PWM cycles for the plurality of output PWM signals based on the PWM parameters and the first count; and
a second signal generation unit comprising a second counter, wherein the second signal generation unit initiates a second count of the second counter responsive to a start of a third PWM cycle of the input PWM signal, the third PWM cycle following the second PWM cycle, and times a generation of a second set of PWM cycles for the plurality of output PWM signals based on the second count.

13. The system of claim 12, wherein:
the sampling module further is to sample the second PWM cycle based on the periodic signal to generate second PWM parameters representative of a duration of an active portion of the second PWM cycle and a total duration of the second PWM cycle; and
the second signal generation unit is to time the generation of the second set of PWM cycles further based on the second PWM parameters.

14. The system of claim 12, further comprising:
a first frequency divider to generate a first generation clock signal to drive the first counter;
a second frequency divider to generate a second generation clock signal to drive the second counter;
wherein the first signal generation unit initiates the first frequency divider in response to the start of the second PWM cycle; and
wherein the second signal generation unit initiates the second frequency divider in response to the start of the third PWM cycle.

15. The system of claim 12, wherein the first signal generation unit times the generation of the first set of PWM cycles by determining a first threshold value representative of a first phase-shift delay for a first output PWM signal, determining a second threshold value representative of a sum of the first phase-shift delay and the duration of the active portion of the first PWM cycle, configuring the first output PWM signal to an active level in response to the first count reaching the first threshold value, and reconfiguring the first output PWM signal to an inactive level in response to the first count reaching the second threshold value.

16. The system of claim 15, wherein the first signal generation unit times the generation of the first set of PWM cycles further by determining a third threshold value representative of a second phase-shift delay for a second output PWM signal, determining, a fourth threshold value representative of a sum of the second phase-shift delay and the duration of the active portion of the first PWM cycle, configuring the second output PWM signal to the active level in response to the first count reaching the third threshold value, and reconfiguring the second output PWM signal to the inactive level in response to the first count reaching the fourth threshold value.

17. The system of claim 15, wherein the second signal generation unit times the generation of the second set of PWM cycles by determining a third threshold value representative of a second phase-shift delay for the first output PWM signal, determining a fourth threshold value representative of a sum of the second phase-shift delay and a duty period of a second PWM cycle of the input PWM signal, configuring the first output PWM signal to an active level in response to the second count reaching the third threshold value, and reconfiguring the first output PWM signal to an inactive level in response to the second count reaching the fourth threshold value.

18. The system of claim 17, wherein the PWM signal generator further comprises a signal combination module having a first input to receive a first representation of the first output PWM signal from the first signal generation unit, a second input to receive a second representation of the first output PWM signal from the second signal generation unit, and an output to provide a combination of the first representation and the second representation as the first output PWM signal.

19. The system of claim 15, wherein the second phase-shift delay is an integer multiple of the first phase-shift delay, and wherein the first signal generation unit is to determine the first phase-shift delay and the second phase-shift delay based on a ratio of a value representative of the total duration of the first PWM cycle and a number of output PWM channels of the plurality of PWM channels.

20. The system of claim 12, further comprising:
a plurality of light emitting diode (LED) strings, each LED string comprising an input to receive a corresponding output PWM signal of the plurality of output PWM signals.

* * * * *